United States Patent [19]
Suzuki et al.

[11] Patent Number: 5,491,108
[45] Date of Patent: Feb. 13, 1996

[54] METHOD OF PRODUCING SEMICONDUCTOR INTEGRATED CIRCUIT DEVICE HAVING INTERPLAYER INSULATING FILM COVERING SUBSTRATE

[75] Inventors: Mieko Suzuki; Tetsuya Homma; Yukinobu Murao; Takaho Tanigawa; Hiroki Koga, all of Tokyo, Japan

[73] Assignee: NEC Corporation, Tokyo, Japan

[21] Appl. No.: 164,580

[22] Filed: Dec. 10, 1993

[30] Foreign Application Priority Data

Jun. 8, 1993 [JP] Japan .................. 5-137215

[51] Int. Cl.⁶ .................................. H01L 21/44
[52] U.S. Cl. .......................... 437/192; 437/913
[58] Field of Search ................. 437/192, 913

[56] References Cited

U.S. PATENT DOCUMENTS

| | | | |
|---|---|---|---|
| 4,872,947 | 10/1989 | Wang et al. | 156/643 |
| 4,874,720 | 10/1989 | McDavid | 437/913 |
| 4,900,257 | 2/1990 | Maeda | 437/192 |
| 4,954,423 | 9/1990 | McMann et al. | 156/643 |
| 4,965,226 | 10/1990 | Grootzen et al. | 437/192 |
| 5,231,053 | 7/1993 | Bost et al. | 437/192 |
| 5,298,458 | 3/1994 | Mieno et al. | 437/187 |
| 5,305,519 | 4/1994 | Yamamoto et al. | 156/646 |

Primary Examiner—R. Bruce Breneman
Assistant Examiner—Linda J. Fleck
Attorney, Agent, or Firm—Sughrue, Mion, Zinn, Macpeak & Seas

[57] ABSTRACT

A method which can markedly improve the flatness of a semiconductor integrated circuit device by forming selectively a layer insulating film on an underlying substrate having level differences is disclosed. First, a Ti—W alloy film is formed on a member which brings about level differences due to wirings or the like, then a PECVD silicon oxide film is formed followed by a plasma treatment using $CF_4$ gas. Further, a silicon oxide film is deposited by atmospheric pressure CVD using ozone and tetraethoxysilane. Then, the surface is flattened by etchback using an organic SOG film, and a silicon oxide film is formed by plasma excited CVD.

6 Claims, 14 Drawing Sheets

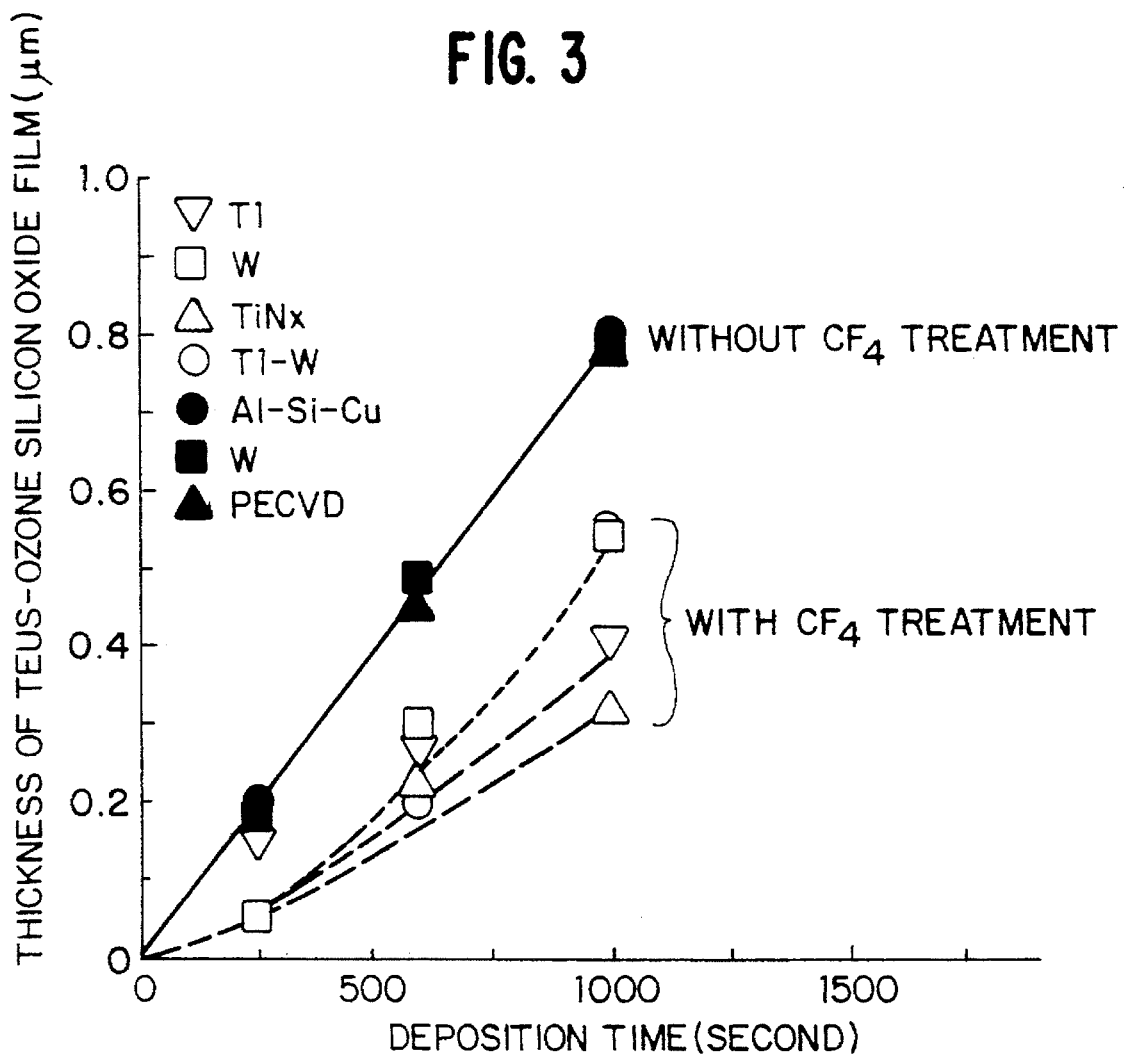

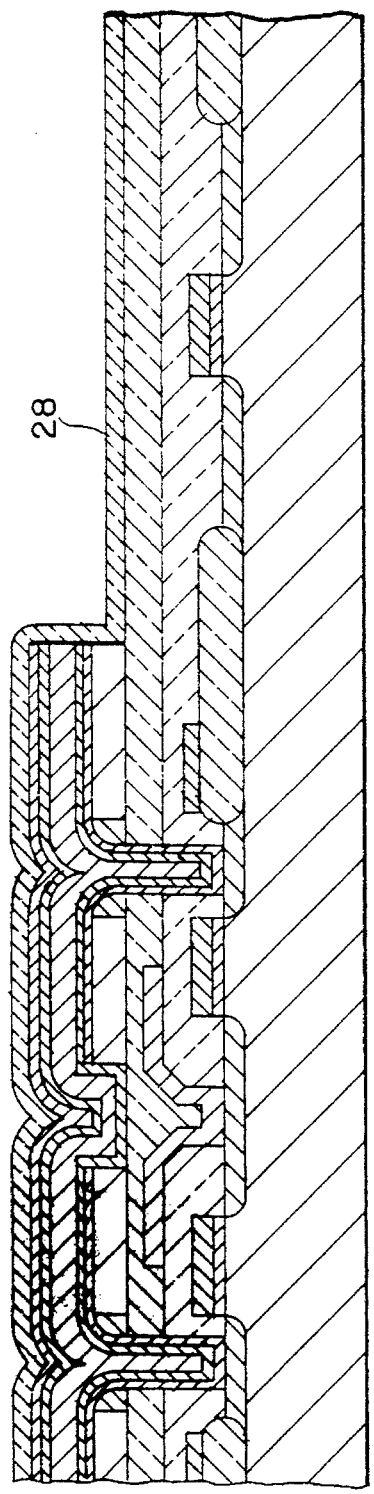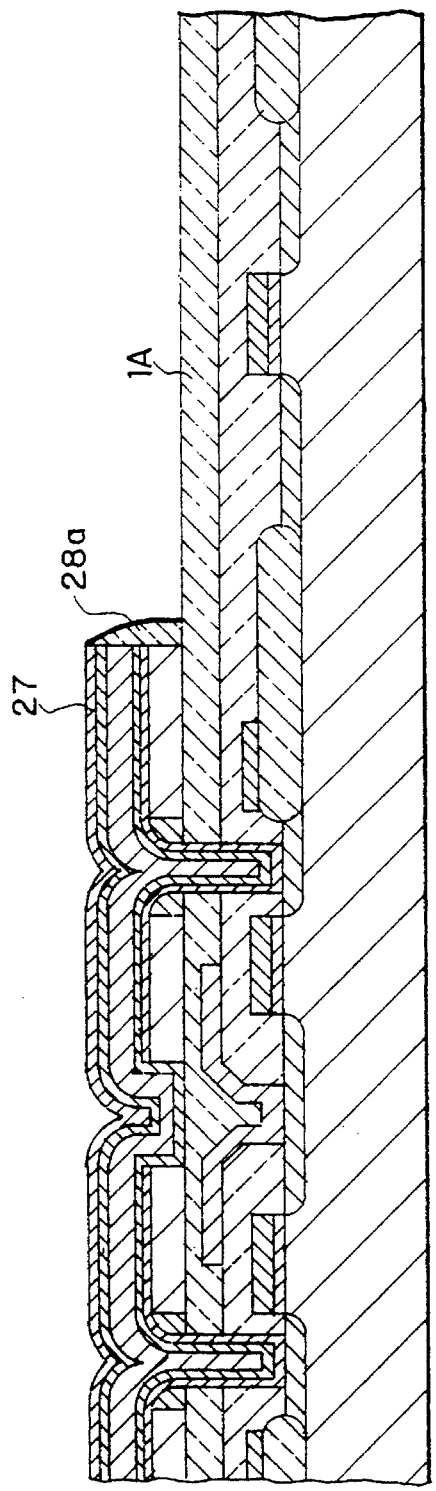
FIG. 4G
FIG. 4H

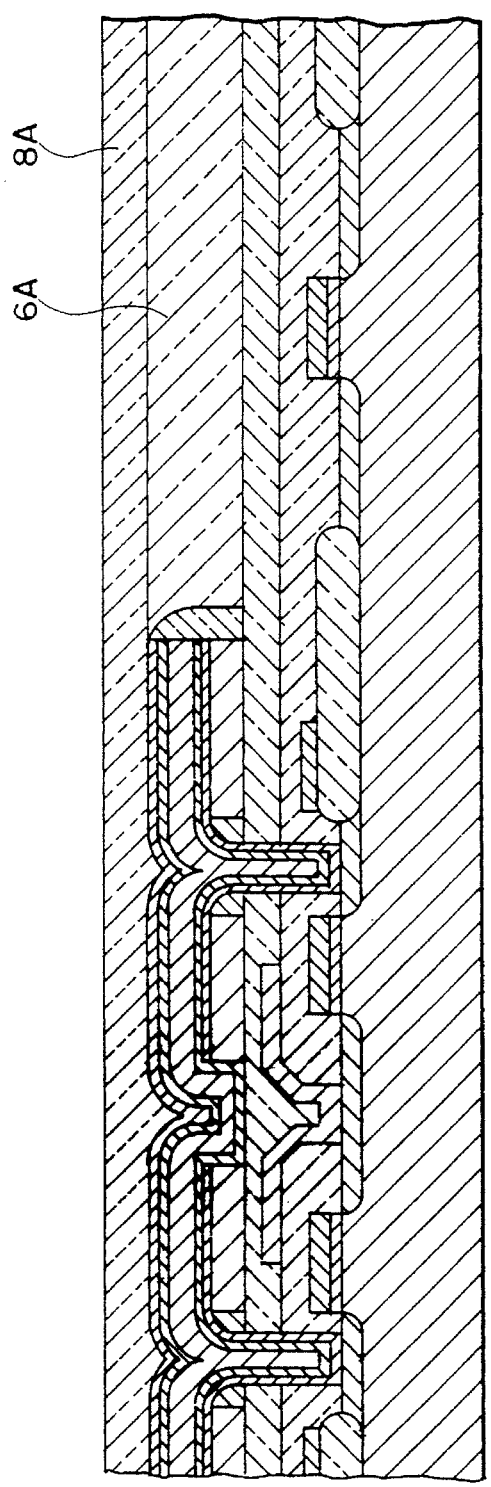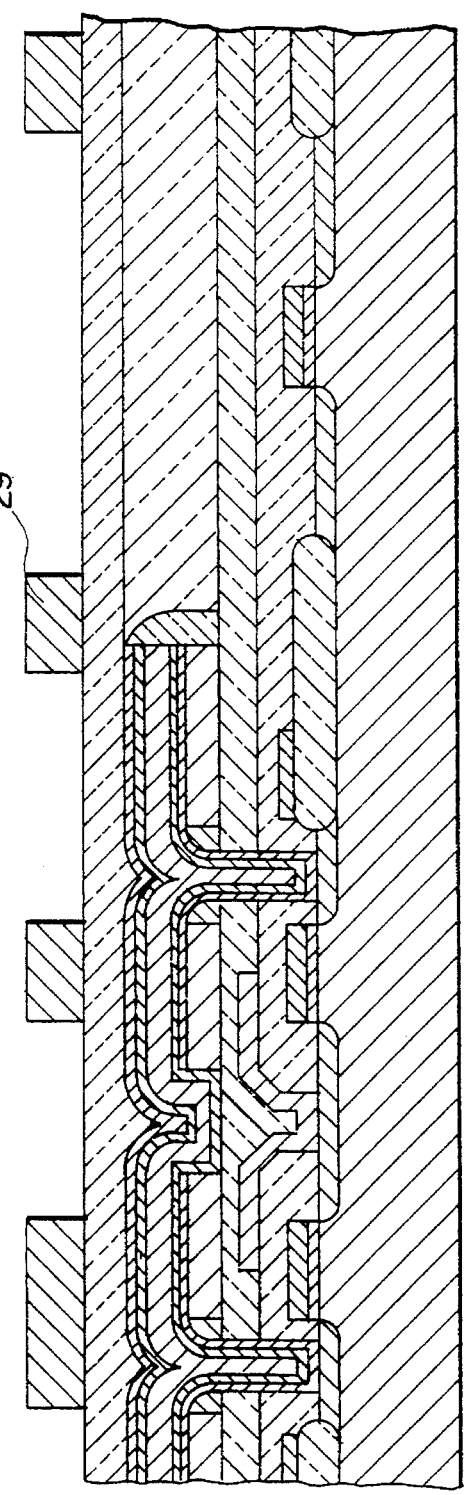

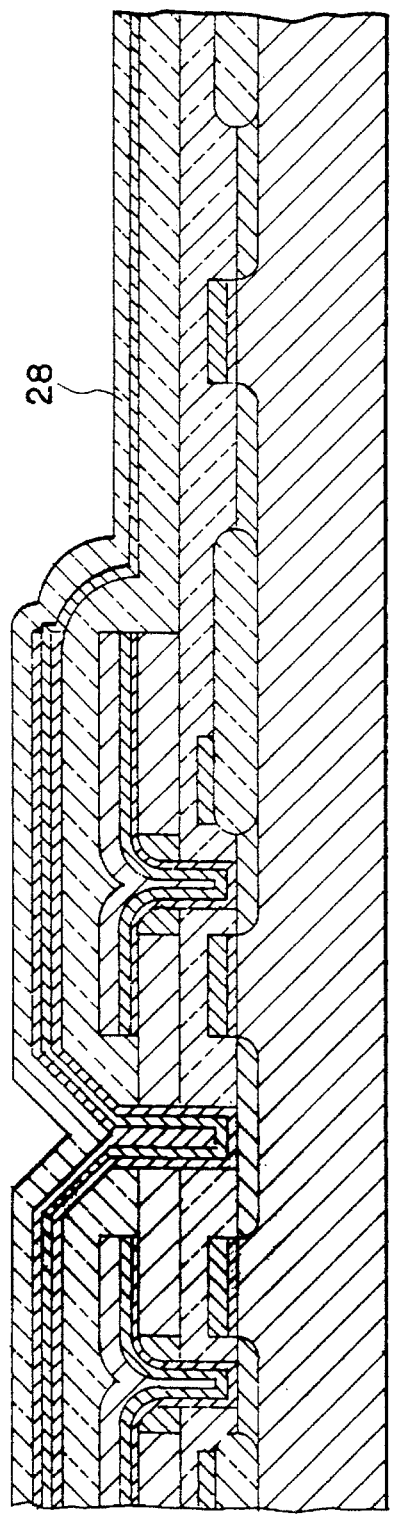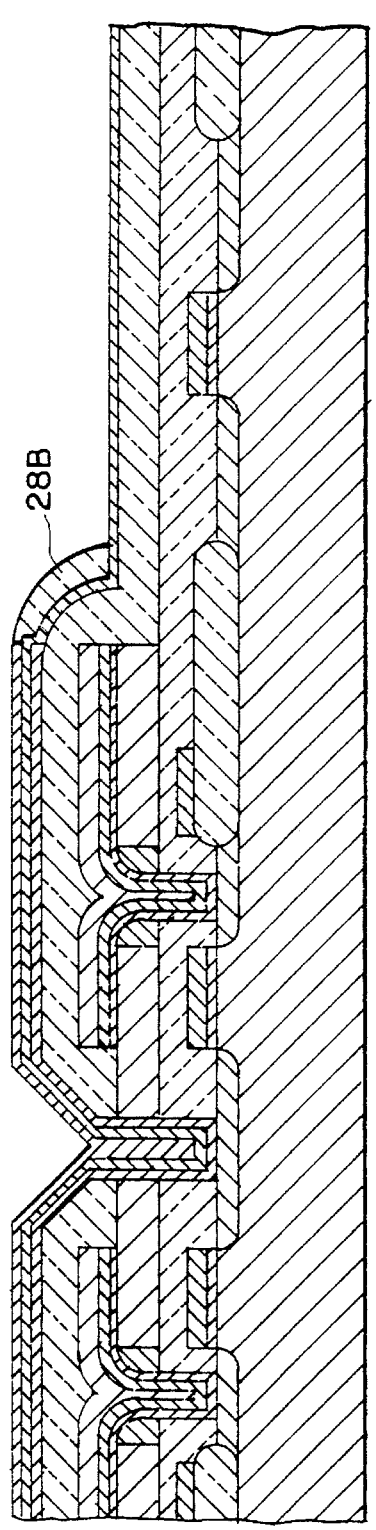

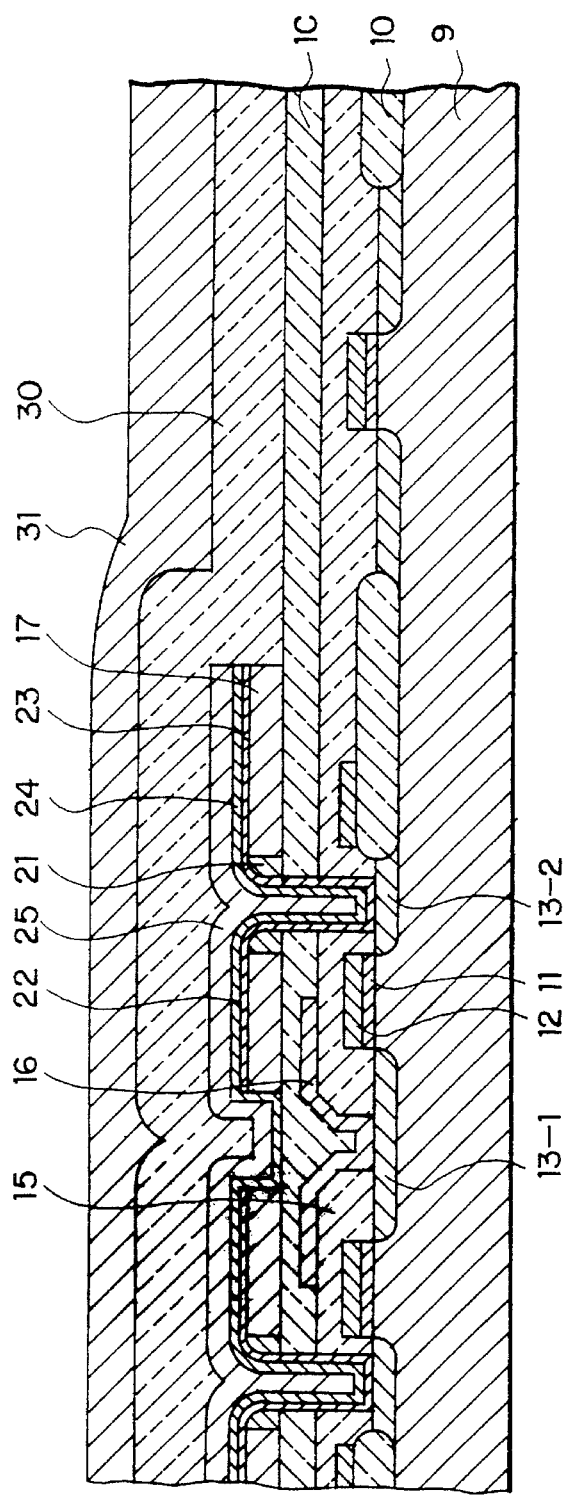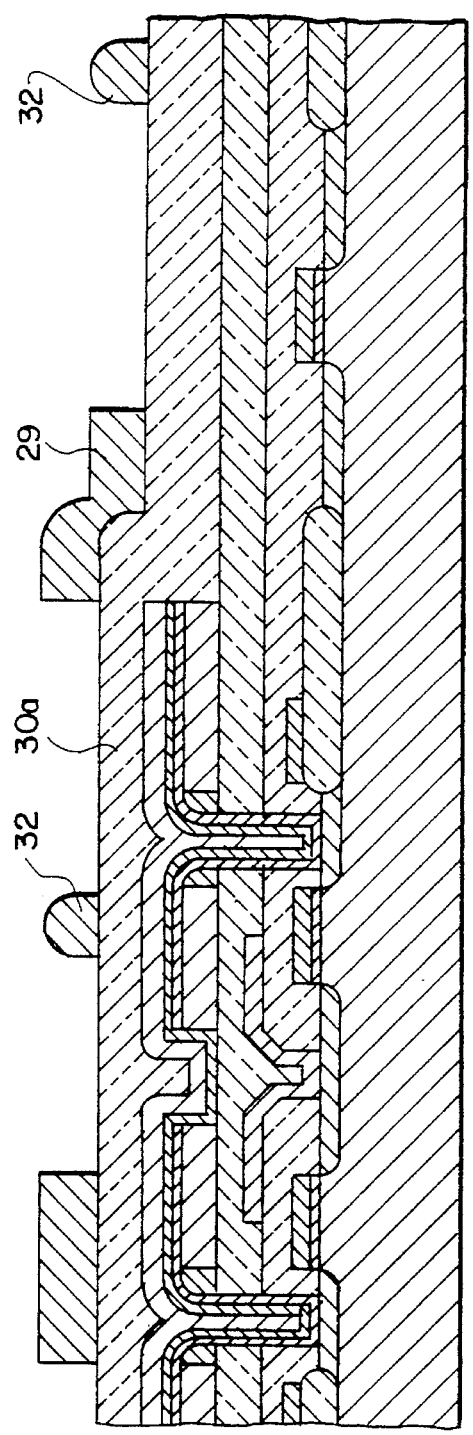
FIG. 6A
PRIOR ART
FIG. 6B
PRIOR ART

METHOD OF PRODUCING SEMICONDUCTOR INTEGRATED CIRCUIT DEVICE HAVING INTERPLAYER INSULATING FILM COVERING SUBSTRATE

BACKGROUND OF THE INVENTION

The present invention relates to a method of producing a semiconductor integrated circuit device and, more particularly, to an improvement of forming a interlayer insulating film covering a semiconductor body having a non-even surface.

In recent years, along with advancements in semiconductor integrated circuit devices, fine patterning of circuit elements and wiring layers has been required more and more to enhance the integration density of the device. A multi-level wiring structure has also become important to interconnect a great number of circuit elements to one another. In order to realize the multi-level wiring structure, at least one interlayer insulating film is required to isolate the lower-level and upper-level wiring layers from each layer.

However, when the semiconductor substrate has a large stop at the surface thereof due to circuit elements formed on the substrate, not in the substrate, undesired conductive films frequently remain on the interlayer insulating film. This drawback will be described in detail below with reference to FIG. 6 illustrating a conventional dynamic memory (DRAM) device.

As shown in FIG. 6A, a semiconductor device shown therein has a memory cell forming region 100 and a peripheral circuit forming region 101. These regions 100 and 101 as well as the respective circuit elements therein are separated by selectively forming a field oxide film 10 on a silicon substrate 9. A plurality of memory cell MOS transistors and associate storage capacitors are formed in the memory cell forming region 100. Each of the MOS transistor includes a pair of n-type source and drain regions 13-1 and 13-2 and a gate electrode 12 formed on a gate oxide film 11. The capacitor has a lower electrode (consisting of a polycrystalline silicon film 17, a sidewall 21 and a polycrystalline silicon film 23), an upper electrode 25 and a dielectric film 22 therebetween. This capacitor is of a stacked capacitor to present a relatively large capacitance value with the reduced occupation area. Thus, the storage capacitor is formed on the substrate so that the upper electrode thereof positioned at a level higher than the principal surface of the silicon substrate. A MOS transistor is also formed in the peripheral region. Next, an interlayer insulating film 30 such as a silicon oxide film is formed over the whole surface of the memory cell and the peripheral regions 100 and 101 by the chemical vapor deposition (CVD) method, followed by coating a photoresist film 31. Subsequently, the resist film 31 is patterned to have a plurality of contact holes and/or via-holes, and the insulating film 30 is then selectively removed by using the patterned photoresist film 31 as a mask.

Thereafter, an aluminum layer is deposited over the entire surface and then patterned to form a plurality of wiring layers 29-1 and 29-2, as shown in FIG. 6B.

Since the silicon oxide film 30 by the CVD method is formed with the substantially uniform thickness (for example, 0.8 μm) over the memory cell region and the peripheral region, the surface shape of the underlying substrate reflects the surface shape of the film 30. For this reason, the oxide film 30 also has a large step at the surface thereof. On the other hand, the photoresist film 30 is not formed with a uniform thickness, but the portion thereof covering the step is made thick, as shown in FIG. 6A. For this reason, deviation in focus in the photolithography for patterning the photoresist film on the Aluminum layer occurs, so that undesired conductive layers 32 remain on the interlayer insulating film 30, as shown in FIG. 6B.

In order to make the surface of the insulating film flat, it is proposed to use a spin-on-glass (SOG) film, but it is difficult in practice to achieve sufficient flatness.

SUMMARY OF THE INVENTION

An object of this invention is to provide a fabrication method of a device in which an interlayer insulating film is formed to reduce level differences on the surface of an underlying substrate.

For this purpose, the present invention is characterized by comprising the steps of forming a conductive layer on an insulating film, the layer having a top layer containing titanium or tungsten, and selectively forming a silicon oxide film by CVD which uses ozone and an organic silicon compound after subjecting the surface of the conductive film to a treatment which causes fluorine to combine with the surface material.

BRIEF DESCRIPTION OF THE DRAWINGS

The above and other objects, features and advantages of this invention will become more apparent with reference to the following detailed description taken in conjunction with the accompanying drawings, wherein

FIG. 3 is a graph illustrating the effect of the $CF_4$ treatment of a Ti film, a W film, a $TiN_x$ film and a Ti—W alloy film;

FIGS. 4A to 4L are cross-sectional views illustrating a method according to a second embodiment of the invention;

FIGS. 5A to 5L are cross-sectional views illustrating a method according to a third embodiment of the invention; and FIGS. 6A and 6B are cross-sectional views illustrating a method according to the prior art.

DESCRIPTION OF THE PREFERRED EMBODIMENTS

Referring now to FIG. 1, a method according to the first embodiment of the invention will be described in detail below.

Figure 1A:
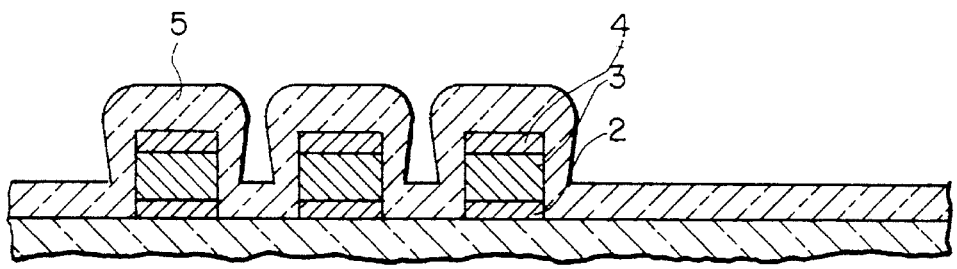
FIGS. 1A to 1F are cross-sectional views illustrating a method according to a first embodiment of the invention.
Figure 1B:
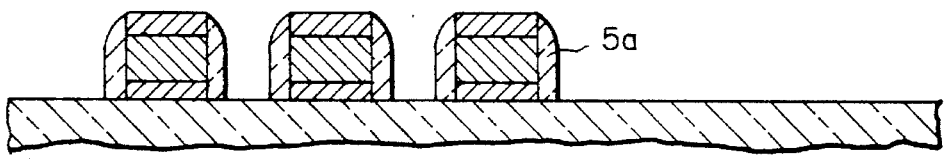

First, as shown in FIG. 1A, a silicon oxide film by the plasma CVD is deposited on a semiconductor substrate (not shown), followed by forming first-level wiring layers each consisting of a $TiN_x$ film/Ti film 2, an Al-Si-Cu film 3 and a Ti—W alloy film 4 containing 10% titanium. The thickness of the Ti—W alloy film 4 is 0.2 μm, and the total thickness of each wiring layer is 0.9 μm. Next, a plasma CVD silicon oxide film 5 is deposited on the entire surface with a thickness of 0.4 μm. Next, sidewall films 5a are formed on the side faces of the wiring layers by anisotropic etching of the plasma CVD silicon oxide film 5 until the surface of the Ti—W alloy film 4 is exposed by means of reactive ion etching carried out under the conditions of a $CF_4$ gas flow rate 30 sccm, carrier gas ($N_2$ or Fe) flow rate 3 sccm, high frequency power 1200 W of 13.56 MHz, and pressure 5.0 Pa, as shown in FIG. 1B.

Figure 2A:
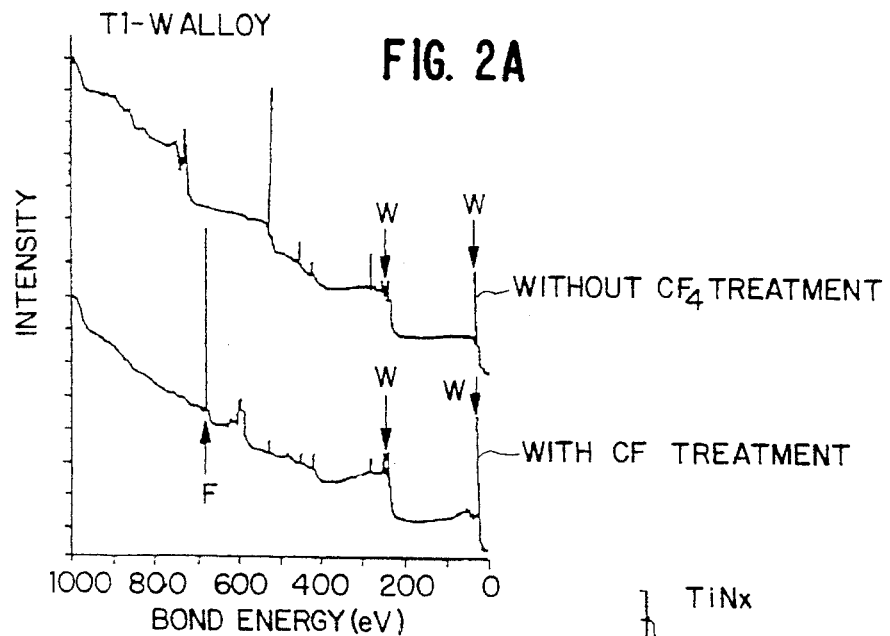
FIGS. 2A to 2C are graphs illustrating the data by the X-ray photoelectron spectroscopy (XPS) for a Ti—W alloy film, a Tl—$N_x$ film, and a plasma CVD silicon oxide film, respectively.
Figure 2B:
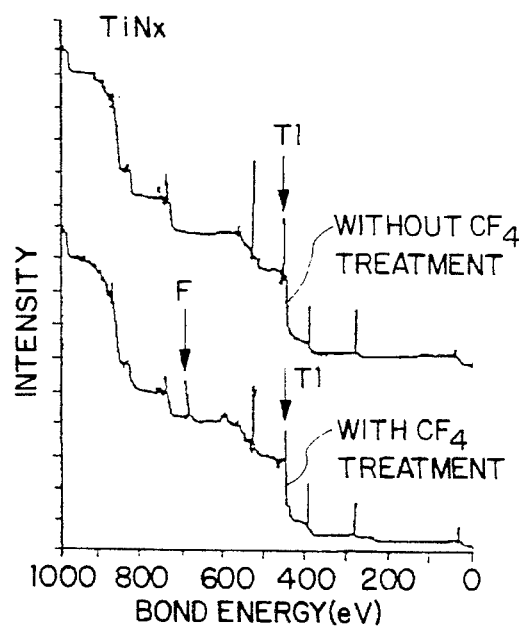
Figure 2C:
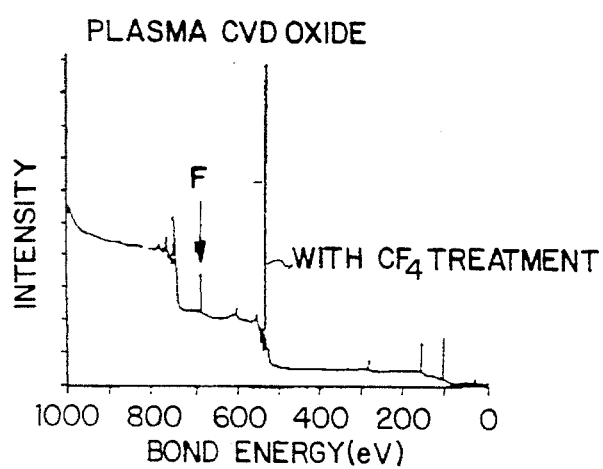

Turning to FIGS. 2A to 2C, there are shown graphs showing the data by X-ray photoelectron spectroscopy (XPS) of the surface of the Ti—W alloy film, the $TiN_x$ film and the PECVD silicon oxide film, respectively. It can be seen from these figures that the Ti—W alloy film subjected to the reactive ion etching using the $CF_4$ gas contains at the surface thereof fluorine combined with titanium and tungsten. Accordingly, fluorine is combined with Ti and W on the surface of the Ti—W alloy film 4 shown in FIG. 1B.

Figure 1C:
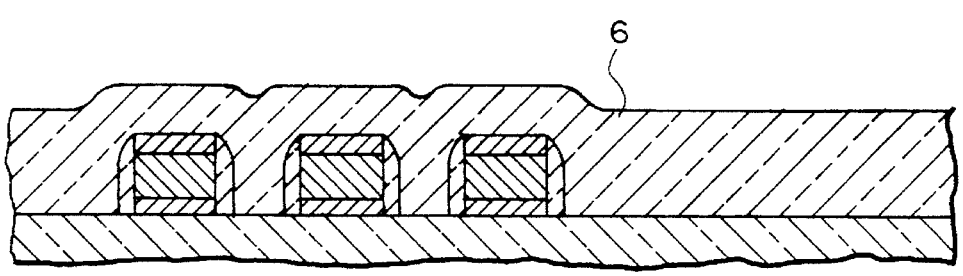

Next, a silicon oxide film 6 is formed by CVD at atmospheric pressure in which the gas flow rate of ozone (contained in oxygen gas passed through an ozonizer) and tetraethoxysilane (TEOS) is 20:1, as shown in FIG. 1C. This oxide film 6 is called hereinafter TEOS-ozone silicon oxide film. The temperature at that method is 390° C., and the deposition rate and the thickness of the film 6 are 50 nm/min and 1.0 μm, respectively.

Turning to FIG. 3, there is shown a graph indicative of the relation between the thickness and the deposition time of the TEOS-ozone silicon oxide film, which reveals that the deposition rate varies with the kind of the underlying material. The deposition rate on the $CF_4$-treated Ti—W alloy film is about one-half of that on the PECVD silicon oxide film. This is due to hindrance of adsorption of siloxane oligomer by fluorine atoms combined into the surface of the Ti—W alloy film. In the plasma CVD silicon oxide film, the $CF_4$ treatment does not affect the deposition rate.

Thus, the step at the surface of the TEOS-ozone silicon oxide film 6 is reduced to about 0.5 μm, as shown in FIG. 1C.

Figure 1D:
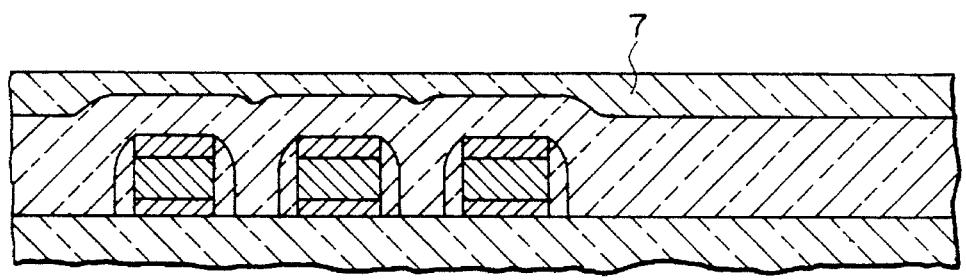
Figure 1E:
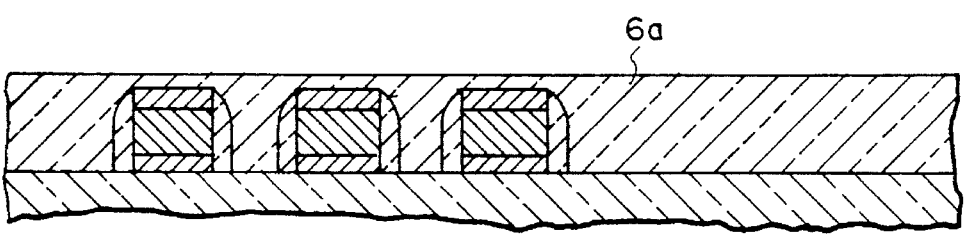

Next, an organic spin-on-glass (SOG) film 7 with thickness in the range of 0.4 to 0.6 μm is formed, as shown in FIG. 1D to make the surface flat. The film 7 is formed by spin coating at 3000 rpm an organic silica solution containing $CH_3Si(OH)_3$, then subjecting the sample to heat treatment in a nitrogen atmosphere at about 300° C. for about 1 hour. Then, the so-called etch-back is carried out to remove the organic SOG film 7 completely by means of a dry etching which uses a mixture of $C_2F_6$ gas, $CHF_3$ gas and He gas. Thus, the surface of the film 6a is made even, as shown in FIG. 1E. Although the surface of the electrode wiring in FIG. 1e is depicted as being covered with the TEOS-ozone silicon oxide film 6a, it is preferable to carry out etch-back until the surface of each electrode wiring is exposed. This is because it is feared that the electrode wiring may be adversely affected by the moisture contained in the TEOS-ozone silicon oxide film.

Figure 1F:
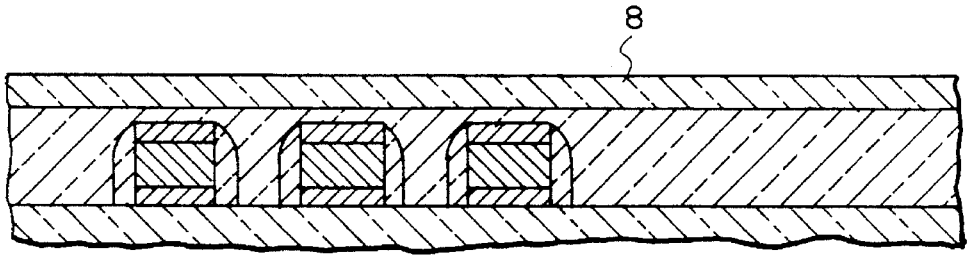

Thereafter, as shown in FIG. 1F, a plasma CVD silicon oxide film 8 having a thickness of 0.4 μm is deposited on the entire surface. Thus, an interlayer insulating film consisting of films 6a and 8 is formed with a flat surface. Subsequently, contact holes and/or via-holes are formed and second-level wiring layers are then formed thereon.

When electrode wirings with constant width are arranged in a orderly manner with constant pitch as in this embodiment, it is possible to realize a nearly perfect flattening. In an actual semiconductor integrated circuit device, electrode wirings with varying width are formed on the same insulating film, so that it does not proceed ideally. The thickness of the TEOS-ozone silicon oxide film deposited on the $CF_4$-treated electrode wirings depends on the width of the electrode wiring. This is because the TEOS-ozone silicon oxide film is deposited thicker in the periphery because of the provision of the sidewall film 5a to the electrode wiring. For this reason, it is difficult to realize a uniformly flat situation for the entire surface at the stage of formation of the organic SOG film, and the actual situation is such that the TEOS-ozone silicon oxide film projects like icebergs here and there. In such a case, the etch-back is carried out under a condition in which the TEOS-ozone silicon oxide film is etched at a greater rate than the organic SOG film. For example, if a selection ratio of 2:1 for the TEOS-ozone silicon oxide and the organic SOG film is desired, one needs to set the flow rates of the $C_2F_6$ gas, the $CHF_3$ gas and the He gas at 10 sccm, 10 sccm and 88 sccm, respectively, the high frequency power at 450 W and the pressure at 260 Pa.

When a semiconductor integrated circuit device of two-layer wiring structure with 0.6 μm rule was experimentally manufactured using such a flattening technique, it was possible to reduce the maximum level difference of 0.9 μm between the top face of the first layer electrode wiring and the top face of the field region to 0.5 μm. Further, when the second layer electrode wiring is connected to the first layer electrode wiring via a via-hole of diameter 0.8 μm, it was possible to realize a resistance of 140 mΩ per via hole. This value is equivalent to the resistance of a via hole formed conventionally in the flattening treatment by SOG etch-back method of the PECVD silicon oxide film.

Referring to FIG. 4, the description on the second embodiment of the invention will be made below.

Figure 4A:
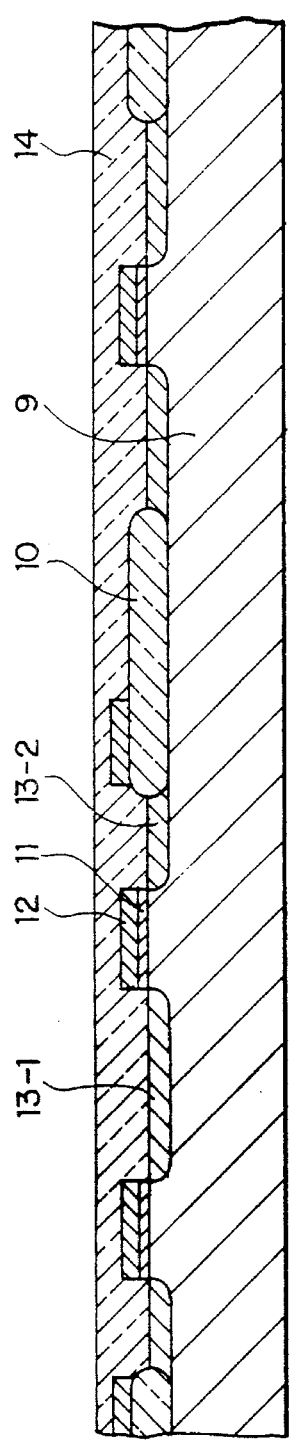

First, as shown in FIG. 4a, 0.4 μm-thick field oxide films 10 are formed in field regions of a silicon substrate 9 by the so-called selective oxidation method. This device is intended to have a memory cell forming region 200 and a peripheral circuit forming region 201. Next, a 10 nm-thick gate oxide film 11 is formed by thermal oxidation in a portion of the surface of the silicon substrate surrounded by the field oxide film 10, and a gate electrode 12 is then formed by depositing a polycrystalline silicon film by low pressure CVD to a thickness of, for example, 0.25 μm, and patterning the film to predetermined shape by photolithography technique and etching technique. Subsequently, n-type source and drain regions 13-1 and 13-2 are selectively formed by ion implantation of arsenic (As) which uses the gate electrode 12 as a mask, followed by depositing over the entire surface a BPSG film 14 containing boron (B) and phosphorus (P) by CVD to a thickness of, for example, 0.4 μm, the surface thereof being then smoothed by subjecting it to a heat treatment for about 30 min in a nitrogen atmosphere at a temperature above 800° C.

Figure 4B:
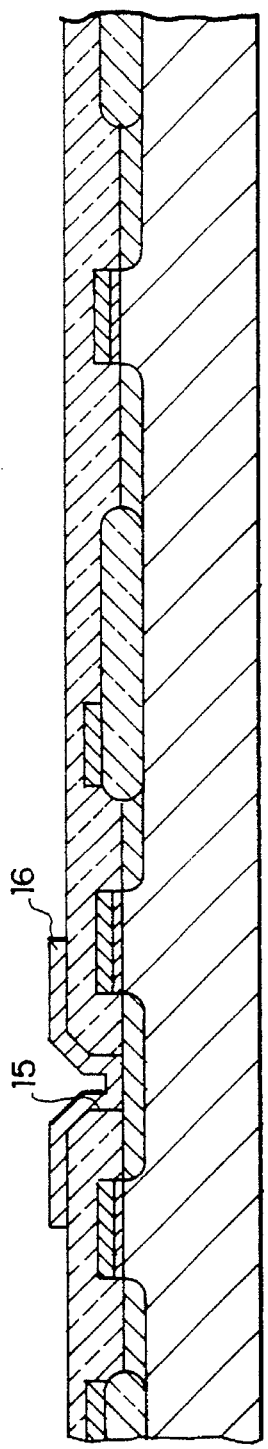

Next, as shown in FIG. 4B, a bit line contact hole 15 is selectively formed to expose a portion of the region 13-1 by an etching which uses a photoresist film (not shown). A tungsten silicide ($WSi_2$) film is then deposited to a thickness of, for example, 0.2 μm, followed by patterning to form a bit line 16.

Figure 4C:
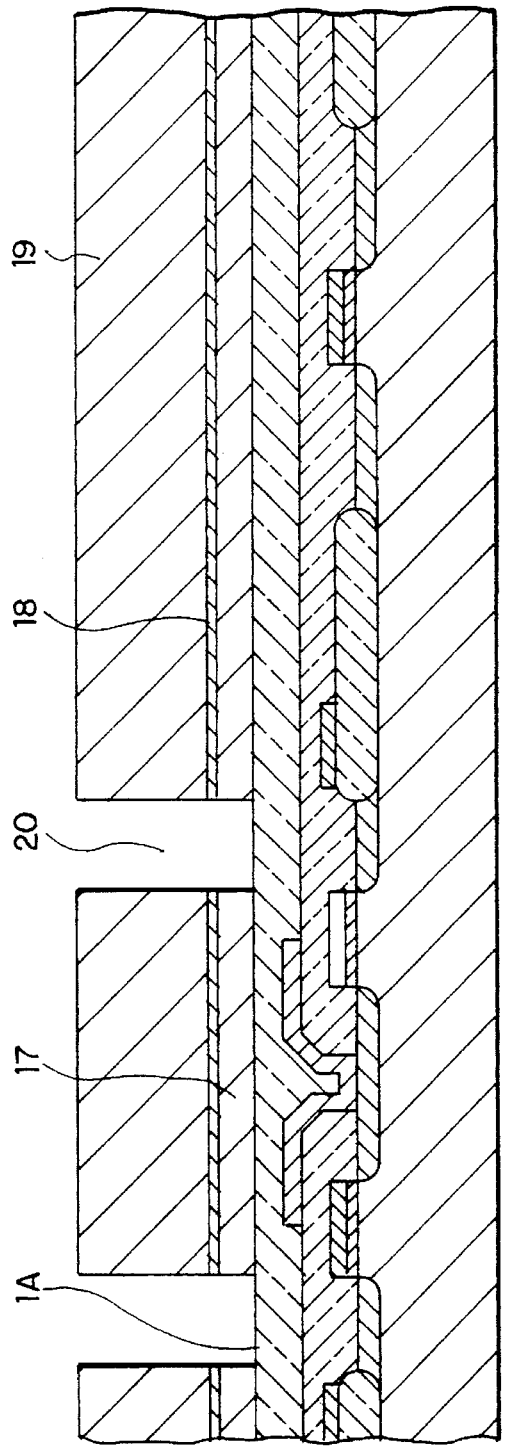

Thereafter, as shown in FIG. 4C, a BPSG film as a first interlayer insulating film 1A is deposited to a thickness of, for example, 0.4 μm, by CVD, followed by smoothing of the surface by a heat treatment in a nitrogen atmosphere at 800° C. or above. Then, a polycrystalline silicon film 17 for a lower electrode of a capacitor is deposited on the entire surface to a thickness of, for example, 0.4 μm, and a silicon oxide film as a mask oxide film 18 is then deposited thereon by CVD to a thickness of, for example, 0.1 μm. Next, the mask oxide film 18 and the polycrystalline silicon film 17 are patterned by an etching using a photoresist film 19 as a mask.

Figure 4D:
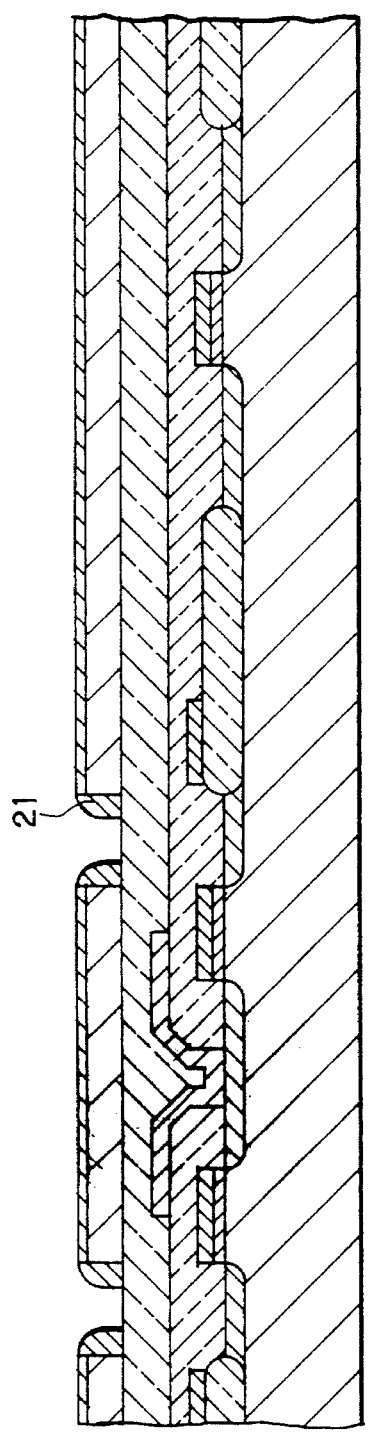

Subsequently, the photoresist film 19 is removed and a polycrystalline silicon film is then deposited with a thickness of, for example, 0.3 μm, on the entire surface. Sidewall polycrystalline silicon films 21 are thereafter formed by etching back the polycrystalline silicon film by anisotropic etching to leave the portions thereof along the side surfaces of the polycrystalline silicon film 17, as shown in FIG. 4D.

Figure 4E:
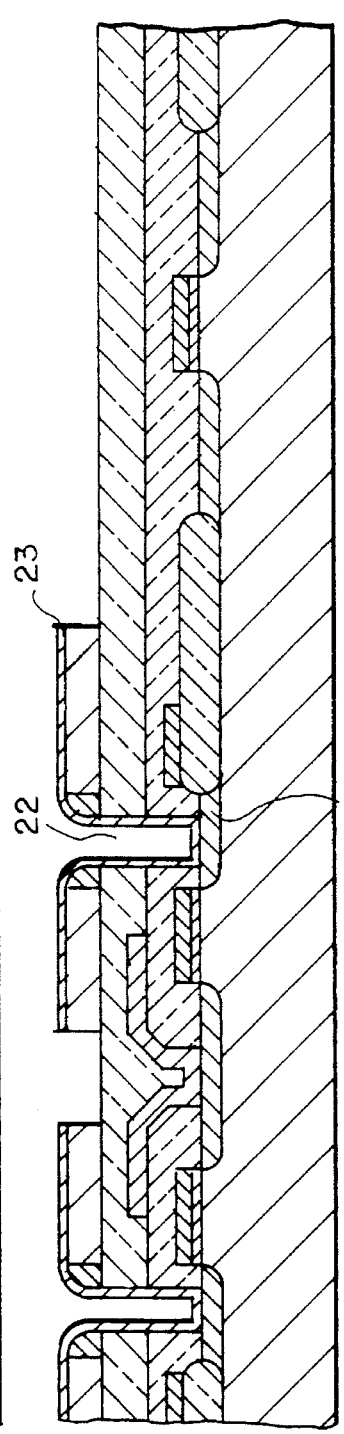
Figure 4F:
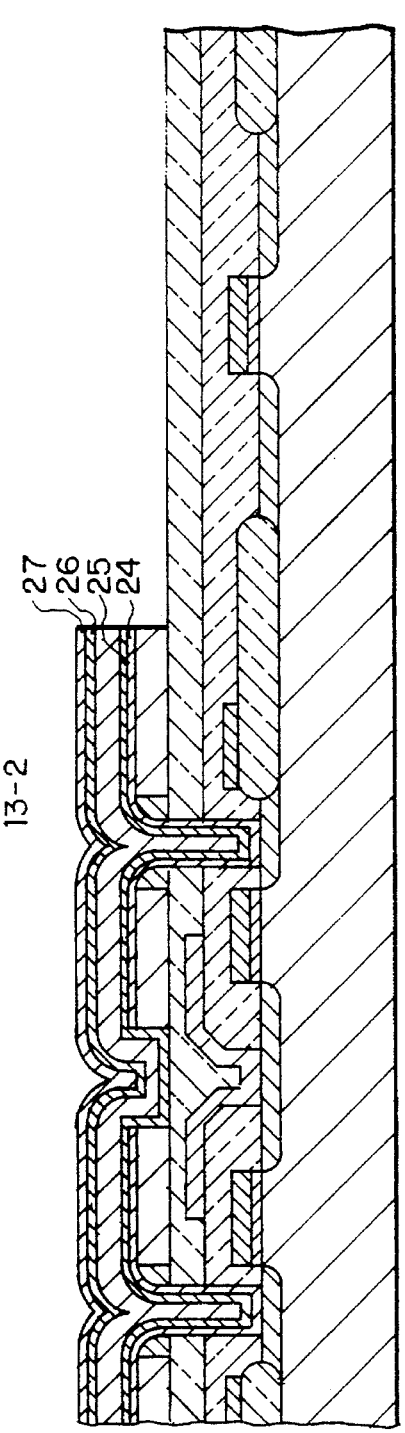

Next, a lower electrode contact 22 is formed in the films 1A and 14 to expose a part of the region 13-2 of the memory cell region, as shown in FIG. 4E, by an etching which uses the polycrystalline silicon film 17 and the sidewall polycrystalline silicon film 21 as masks. Subsequently, polycrystalline silicon films 23 forming a part of each lower electrode are deposited to a thickness of, for example, 0.1 μm, and the lower electrode is formed by patterning the stacked film of polycrystalline silicon films 23 and 17 by means of an etching which uses a photoresist film.

Next, as shown in FIG. 4C, a silicon nitride film 24 as a dielectric film is deposited to a thickness of, for example, 7 nm, and a capacitor counter electrode of the capacitor is formed by forming a polycrystalline silicon film 25 to a thickness of, for example, 0.2 μm, completing the formation of a stacked capacitor. As a result, the step or the level difference generated between the memory cell region and the peripheral region becomes 0.8 μm. Further, the formation of a first member is thereafter completed by depositing a silicon oxide film 26 to a thickness of, for example, 0.1 μm, then forming by sputtering a Ti—W alloy film 27 (first conductive film) to a thickness of, for example, 0.1 μm, and patterning the film to a prescribed shape using photolithography technique and etching technique. At this stage, the level difference becomes about 1 μm.

Next, as shown in FIG. 4G, a silicon oxide film 28 is formed by plasma CVD to a thickness of, for example, 0.2 μm, followed by etching back to form a sidewall film 28a as shown in FIG. 4H by etching the surface of the silicon oxide film by means of an anisotropic etching under the conditions of flow rate 30 sccm of $CF_4$ gas, high frequency power (frequency 13.56 MHz) 1200 W, and pressure 5.0 Pa. At the same time, fluorine is combined with Ti and W on the surface of the Ti—W alloy film 27, as mentioned hereinbefore.

Figure 4I:
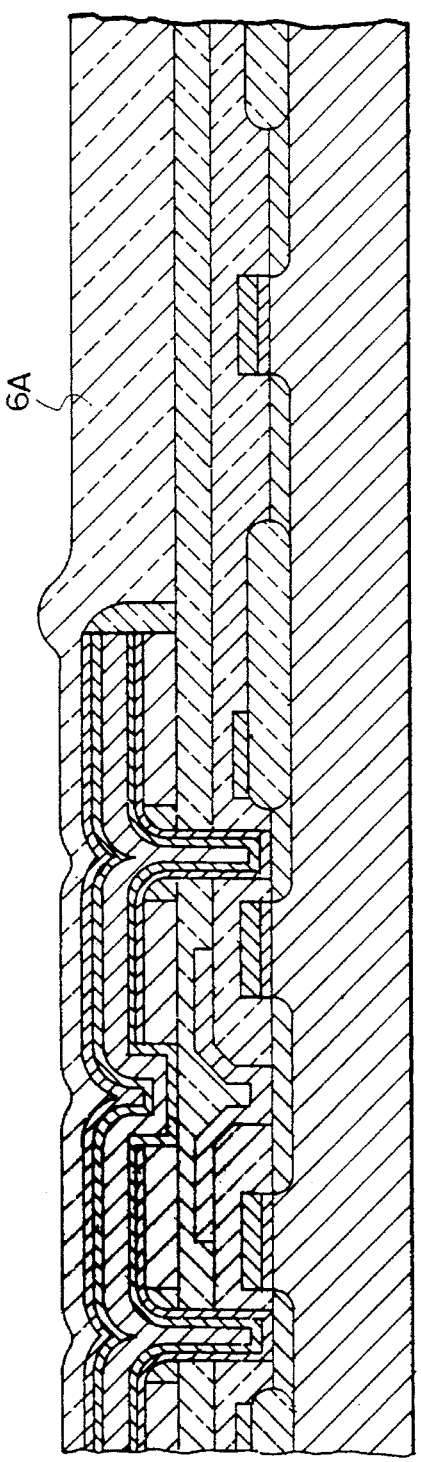

Next, a TEOS-ozone silicon oxide film 6A is deposited as shown in FIG. 4I by atmospheric pressure CVD with the flow rate ratio for ozone and TEOS of 20:1. As also described above, the thickness of the TEOS-ozone silicon oxide film 6A is 1.0 μm in the peripheral region 0.2 μm in the memory cell region, and about 0.4 μm in the boundary part therebetween. Because of the larger area of the memory cell region, the selectivity is improved over the first embodiment, giving rise to the value of about 0.2 μm. The layer insulating film 1A which is a BPSG film showed a deposition rate similar to that of the PECVD silicon oxide film.

Figure 4J:
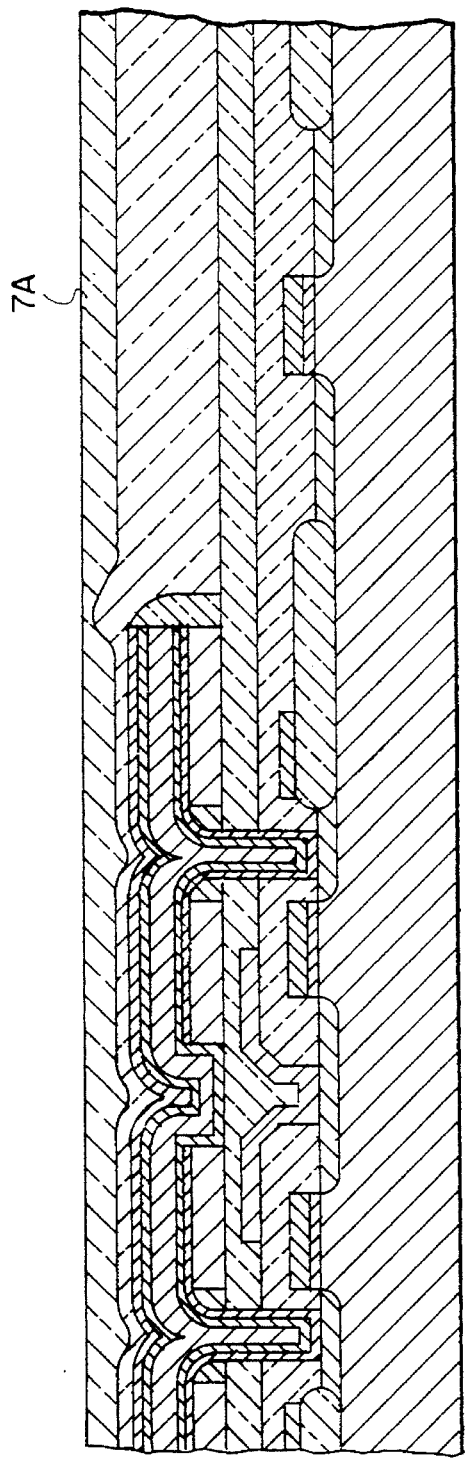

Subsequently, analogous to the first embodiment, after spin coating an organic silica solution whose principal component is represented by chemical formula $CH_3Si(OH)_3$ at 3000 rpm, an organic SOG film 7A (organic film) is formed, as shown in FIG. 4J, to a thickness of, for example, 0.5 μm, followed by a heat treatment in a nitrogen atmosphere of about 300° C. for about 1 hour.

Then, the etch-back is carried out until the surface of the Ti—W alloy film is exposed as shown in FIG. 4K. Next, a silicon oxide film 8A is deposited to a thickness of for example, 0.4 μm, by the plasma CVD. Contact holes and/or via-holes are formed in the films 8A and 6A, and upper aluminum wiring layers 29 are then formed as shown in FIG. 4L.

A trial manufacture of a 64MDRAM using the above-mentioned flattening technique confirmed realization of a level difference of about 0.8 μm. Considering the fact that the conventional use of a photoresist or an SOG film permits one to obtain a level difference of about 1.3 μm at the least, this result represents a substantial improvement over the prior art. As a result, the thickness of the resist film in the lithography technique at the time of formation of the upper wiring becomes uniform and the patterning precision becomes 0.1 μm, facilitating the formation of fine wirings.

Referring to FIG. 5, the third embodiment of the invention will be described below.

In contrast to the formation of the capacitor after formation of the bit line in the second embodiment, a bit line will be formed after formation of a capacitor in this embodiment.

Figure 5A:
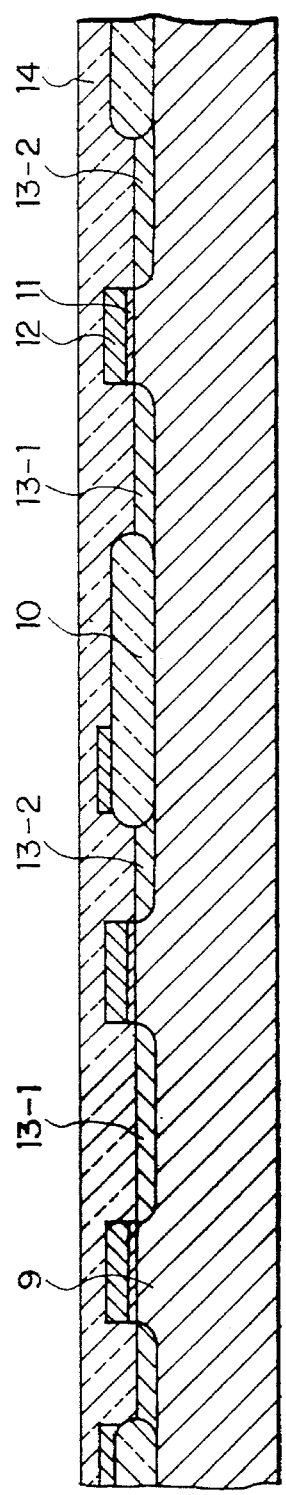
Figure 5B:
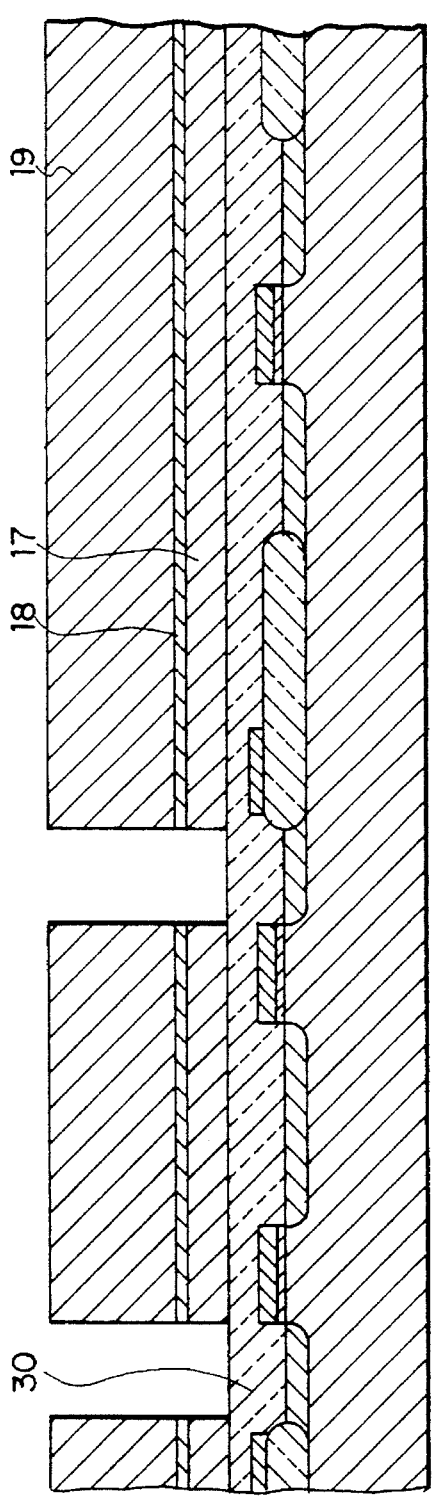
Figure 5C:
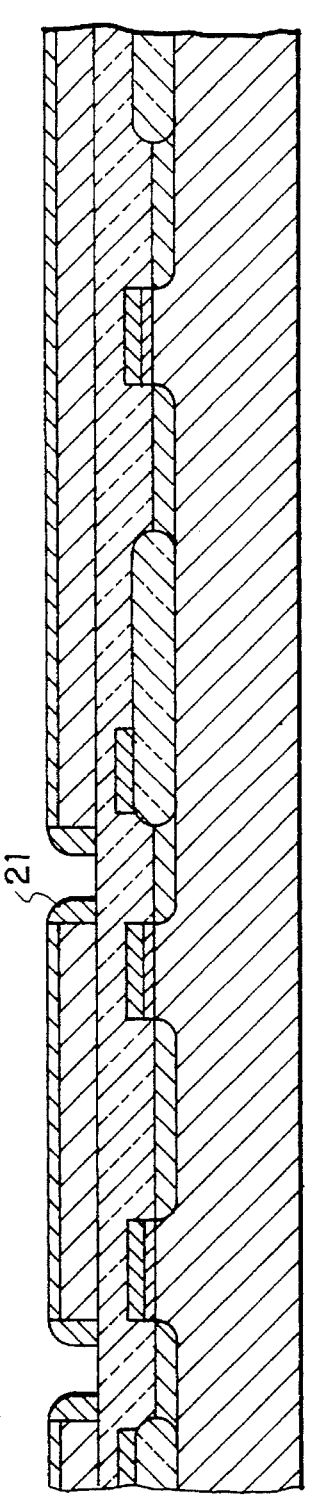

First, as shown in FIG. 5A, a 0.4 μm-thick field oxide film 10 is formed in prescribed regions of the surface of a silicon substrate 9, and a gate electrode 12 is formed by forming a 10 nm-thick gate oxide film 11 by thermal oxidation on the surface of the silicon substrate surrounded by the field oxide film 10. Subsequently, $n^+$-type source and drain regions 13-1 and 13-2 are formed by ion implantation of arsenic (As) to prescribed regions using the gate electrode 12 as a mask. Next, as shown in FIG. 5B, a BPSG film as a layer insulating film 30 is deposited by CVD to a thickness of, for example, 0.4 μm, and the surface is smoothed by a heat treatment in a nitrogen atmosphere of 800° C. or above. Then, a polycrystalline silicon film 17 is deposited on the entire surface to a thickness of, for example, 0.4 μm in order to construct a lower electrode, and a silicon oxide film is deposited by CVD as a mask oxide film 18 to a thickness of, for example, 0.1 μm. Following that, the mask oxide film 18 and the polycrystalline silicon film 17 are patterned using a photoresist film 19 as a mask. Next, after formation of a polycrystalline silicon film on the entire surface to a thickness of, for example, 0.3 μm, the film is etched back by an anisotropic etching leaving the film along the inner side of the polycrystalline silicon film 17 where a part of the lower electrode is formed as shown in FIG. 5C to form a sidewall polycrystalline silicon film 21.

Figure 5D:
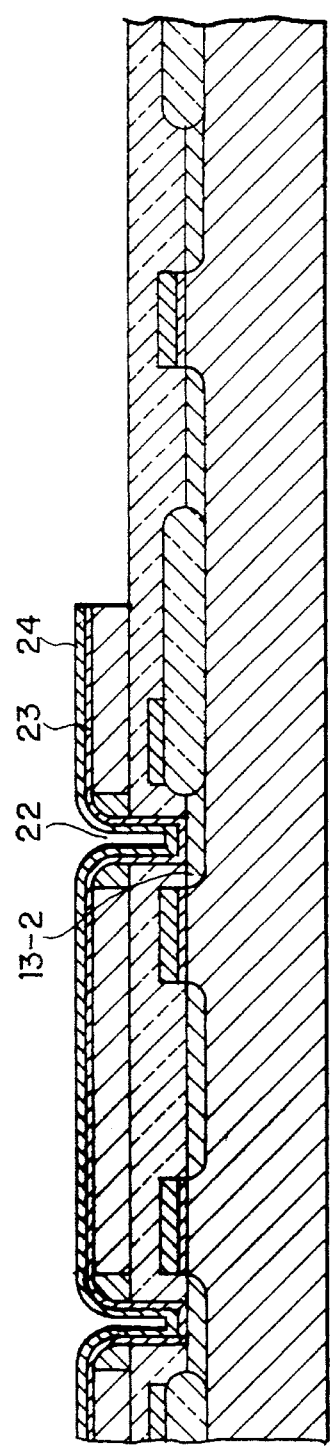
Figure 5E:
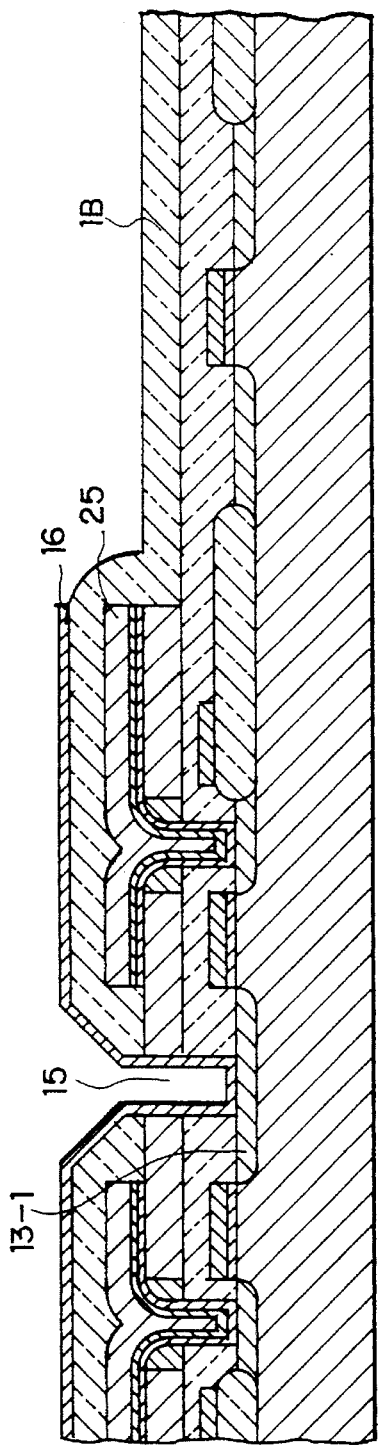
Figure 5F:
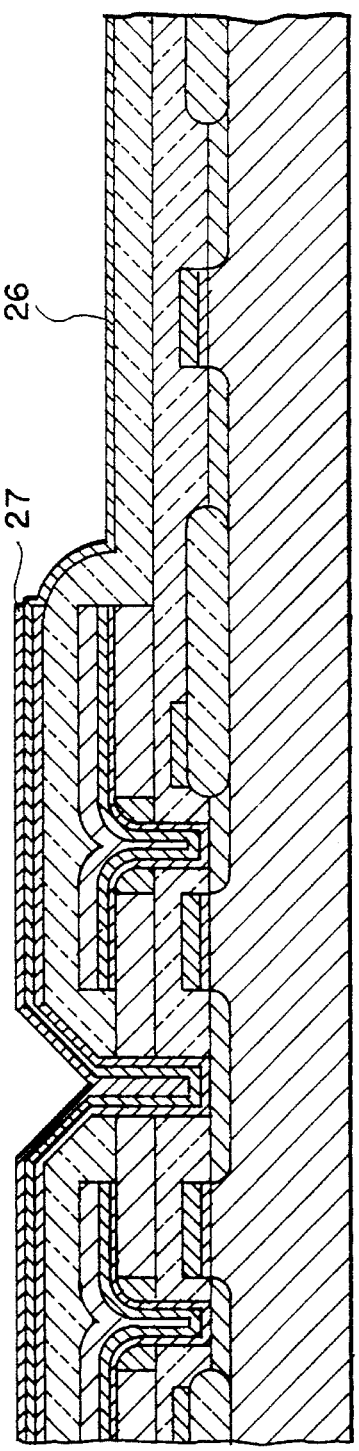

Next, a lower electrode contact 22 is formed on the $n^+$-type source-drain region 13-2 of the memory cell part as shown in FIG. 5D by an etching which uses the polycrystalline silicon film 17 and the sidewall polycrystalline silicon film 21 as masks. Following that, a polycrystalline silicon film 23 is deposited on the entire surface to a thickness of, for example, 0.1 μm, a silicon nitride film 24 as a capacitor insulating film is deposited to a thickness of, for example, 7 nm, a polycrystalline silicon film 25 is deposited as shown in FIG. 5E to a thickness of, for example, 0.2 μm, and a capacitor counter electrode is formed by patterning etching which uses a photoresist film, completing the formation of a stacked capacitor (second member). Then, after formation of a BPSG film as a layer insulating film 1B (second insulating film) on the entire surface by CVD to a thickness of, for example, 0.4 μm, the surface is smoothed by a heat treatment in a nitrogen atmosphere at 800° C. or above for about 30 min. Following that, a bit line contact hole 15 is formed at a prescribed position in the $n^+$-type source-drain region 13-1 of the memory cell part by an etching which uses a photoresist film as a mask, then a tungsten silicide film is deposited to a thickness of, for example, 0.2 μm to form a bit line 16. Subsequently, as shown in FIG. 5F, a silicon oxide film 26 is deposited to a thickness of, for example, 0.1 μm, then a Ti—W alloy film 27 (second conductive film) is formed by sputtering to a thickness of, for example, 0.1 μm, and patterned on a prescribed region by using photolithography technique and etching technique.

Figure 5I:
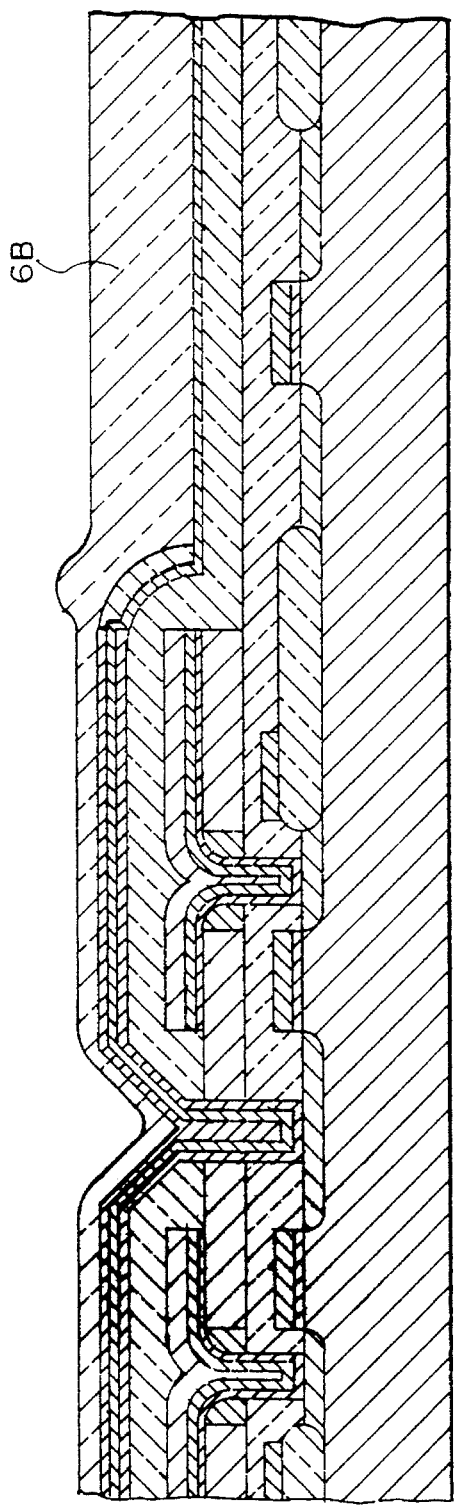
Figure 5J:
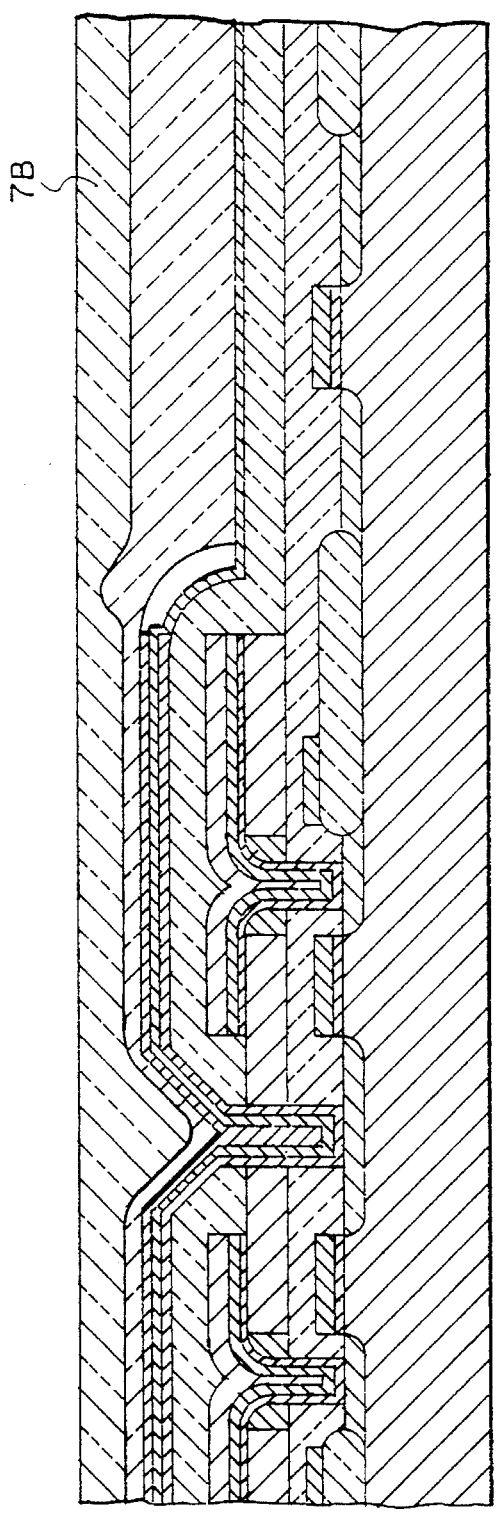

Next, as shown in FIG. 5G, a silicon oxide film (third insulating film) 28 is formed by plasma, excited CVD to a thickness of, for example, 0.2 μm. Further, a sidewall film 28 is formed as shown in FIG. 5H by etching the surface of the silicon oxide film 28 by an anisotropic etching which uses $CF_4$ gas at the flow rate of 30 sccm under high frequency power (frequency 13.56 MHz) of 1200 W and pressure of 5.0 Pa. Next, a TEOS-ozone silicon oxide film 6B is deposited to a thickness (peripheral region) of, for example, 1.0 μm as shown in FIG. 5I by atmospheric pressure CVD with the ozone to TEOS flow rate ratio of 20:1. Subsequently, after spin coating an organic silica solution whose principal constituent is represented by chemical formula $CH_3Si(OH)_3$ at 3000 rpm, an organic SOG film (organic film) 7B is formed to a thickness of, for example, 0.5 μm as shown in FIG. 5J by subjecting the sample to a heat treatment in a nitrogen atmosphere at about 300° C. for about 1 hour.

Figure 5K:
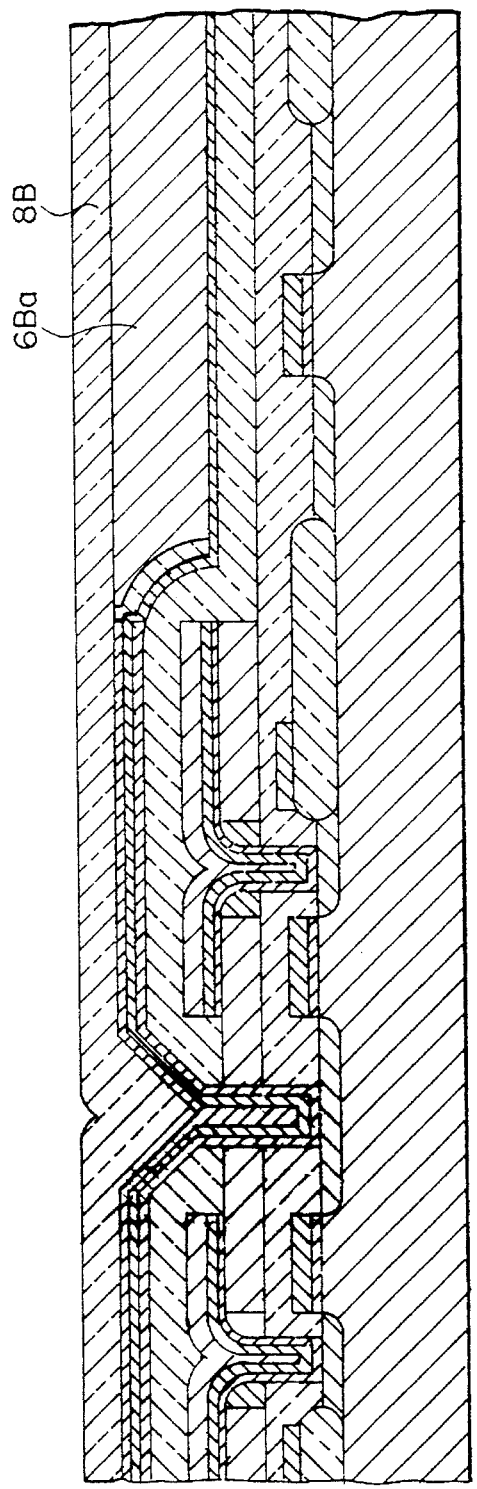
Figure 5L:
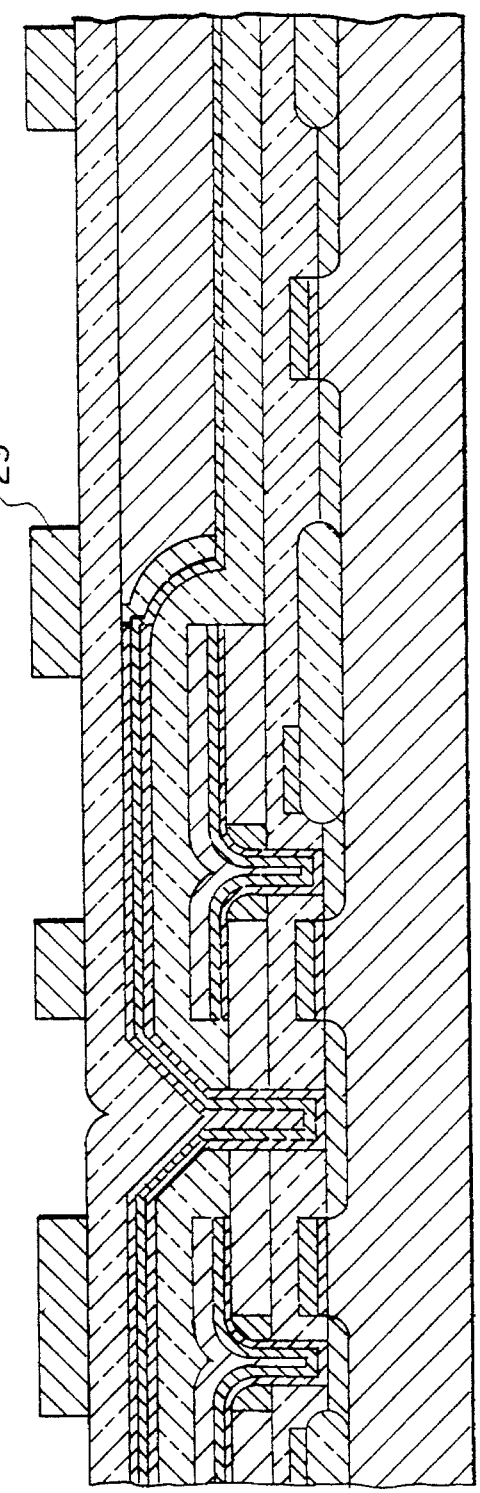

Then, as shown in FIG. 5K, the organic SOG film is etched back by dry etching until the film is completely removed. Then, a silicon oxide film 8B is deposited by plasma CVD to a thickness of, for example, 0.4 μm. Next, after opening a through hole not shown, an upper aluminum electrode 29 is formed as shown in FIG. 5L.

In the first to the third embodiments, a Ti—W alloy film is formed on the element crowding part (wiring region or memory cell region), but a similar result can be obtained when at least one or more of a titanium film, a titanium nitride film, and a tungsten film are used.

In the second and the third embodiments, the titanium-based or the tungsten-based film on the element crowding part was retained, but a similar result can be obtained even if the titanium-based or the tungsten-based film is removed after the etchback using the organic film.

A similar result as in the embodiments can be obtained if one or more of the fluorine compounds $CHF_3$, $C_2F_6$, $SF_6$, $CCl_2F_2$, $NF_3$ or the like are used instead of $C_4$ used for the surface treatment.

A dry etching method is used in the embodiments as a method of treating the surface of the Ti—W alloy film and the silicon oxide film, but a similar result can be obtained if an ion implantation method using one or more of arsenic trifluoride ions, arsenic pentafluoride ions and boron trifluoride ions are employed.

In the embodiments, tetraethoxysilane is used as an organic silicon compound, but a similar result can be obtained if one or more of the following compounds are used instead: $SiH(R)_3$ (trialkylsilane), $SiH(OR)_3$ (trialkoxysilane), $Si(R)_4$ (tetraalkylsilane), $Si(OR)_4$ (tetraalkoxysilane), $(OSi(R)_3)_2$ (hexaalkyldisiloxane) $(OSi(OR)_3)_2$ (hexaalkoxydisiloxane), $(OSi(R)_2)_3$ (hexaalkylcyclotrisiloxane), $(OSi(OR)_2)_3$ (hexaalkoxycyclotrisiloxane), $(OSi(R)_2)_4$ (octaalkylcyclotetrasiloxane), $(OSi(OR)_2)_4$ (octaalkoxycyclotetrasiloxane), where R stands for the alkyl group.

Moreover, in the atmospheric pressure CVD, the flow rate ratio of ozone to tetraethoxysilane is chosen to be 20:1, but the flow rate ratio only needs to be equal to or greater than 11:1, and high pressure CVD or low pressure CVD can also be used.

Moreover, an organic SOG film is used as an organic film in the embodiments, but a similar result can be obtained even if a resist film, a polyimide resin film, or a polystyrene film is used instead.

Further, aluminum wiring is used as the upper wiring, but a similar result can be obtained even if a metallic wiring consisting of one or more of aluminum alloys (such as aluminum-silicon-copper) and titanium alloys (such as titanium nitride and titanium-tungsten) are used instead.

Furthermore, in the second and the third embodiments, description is given in conjunction with DRAM, but a similar result can be obtained for a semiconductor element substrate for CCD, a gate array or the like.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments that fall within the scope of the invention.

What is claimed is:

1. A method of fabricating a semiconductor integrated circuit device comprising the steps of:

covering a semiconductor substrate with a first insulating film;

selectively forming a first conductive layer on said first insulating film, said first conductive layer having a top layer containing at least one of titanium and tungsten;

combining fluorine with said at least one of titanium and tungsten on a surface portion of said top layer of said first conductive layer; and depositing, by means of chemical vapor deposition using an organic silicon compound and ozone, a silicon oxide film on a surface of said first insulating film and on said surface portion of said top layer of said first conductive layer, wherein said first conductive layer has fluorine combined with said at least one of titanium and tungsten on said surface portion of said top layer during said depositing step.

2. The method as claimed in claim 1, further comprising a step of depositing a second insulating film to cover said first conductive layer, wherein said combining step is performed by anisotropic etching of said second insulating film by reactive ion etching using a fluorine compound gas until said first conductive layer is exposed, thereby selectively leaving said second insulating film to form insulating sidewalls on side faces of said first conductive layer.

3. The method as claimed in claim 1, further comprising the step of forming an organic film by spin coating on said silicon oxide film and carrying out etch-back on said organic film.

4. The method as claimed in claim 1, wherein said first conductive layer is selected from a group consisting of a titanium film, titanium nitride film, a tungsten film or a titanium-tungsten alloy film.

5. A method of fabricating a semiconductor integrated circuit device comprising the steps of:

fluorinating elevated conductive surfaces of said semiconductor device, wherein said conductive surfaces contain at least one of titanium and tungsten; and depositing a silicon oxide film on said semiconductor integrated circuit device and over said fluorinated elevated conductive surfaces.

6. The method as claimed in claim 5, wherein said fluorinating step is performed by anisotropic etching by a reactive ion etching using a fluorine compound gas.

* * * * *

UNITED STATES PATENT AND TRADEMARK OFFICE
CERTIFICATE OF CORRECTION

PATENT NO. : 5,491,108
DATED : February 13, 1996
INVENTOR(S) : Mieko SUZUKI, et al.

It is certified that error appears in the above-indentified patent and that said Letters Patent is hereby corrected as shown below:

Column 7, line 37, delete "$C_4$" and insert therefor --$CF_4$--.

Signed and Sealed this

Second Day of July, 1996

Attest:

BRUCE LEHMAN

Attesting Officer

Commissioner of Patents and Trademarks